US006765795B2

(12) United States Patent
Modica

(10) Patent No.: US 6,765,795 B2
(45) Date of Patent: Jul. 20, 2004

(54) MODULAR FAN BRICK AND METHOD FOR EXCHANGING AIR IN A BRICK-BASED COMPUTER SYSTEM

(75) Inventor: Steve Modica, Inver Grove Heights, MN (US)

(73) Assignee: Silicon Graphics, Inc., Mountain View, CA (US)

( * ) Notice: Subject to any disclaimer, the term of this patent is extended or adjusted under 35 U.S.C. 154(b) by 20 days.

(21) Appl. No.: 10/200,803

(22) Filed: Jul. 23, 2002

(65) Prior Publication Data

US 2004/0017653 A1 Jan. 29, 2004

(51) Int. Cl.[7] .................................................. G06F 1/16
(52) U.S. Cl. ........................ 361/695; 361/690; 454/184; 165/104.34
(58) Field of Search ................................ 361/687–695, 361/831; 165/121; 415/177, 178, 213.1, 214–214.1; 454/184

(56) References Cited

U.S. PATENT DOCUMENTS

| | | | | |
|---|---|---|---|---|
| 5,398,159 A | * | 3/1995 | Andersson et al. | 361/695 |
| 6,041,851 A | * | 3/2000 | Diebel et al. | 165/104.33 |
| 6,375,561 B1 | * | 4/2002 | Nicolai et al. | 454/184 |
| 6,457,949 B1 | * | 10/2002 | Bendikas et al. | 417/360 |
| 6,499,609 B2 | * | 12/2002 | Patriche et al. | 211/175 |
| 6,504,717 B1 | * | 1/2003 | Heard | 361/695 |
| 6,554,697 B1 | * | 4/2003 | Koplin | 454/184 |

* cited by examiner

Primary Examiner—Darren Schuberg
Assistant Examiner—Anthony Q. Edwards
(74) Attorney, Agent, or Firm—Schwegman, Lundberg, Woessner & Kluth, P.A.

(57) ABSTRACT

A modular computing system that includes an enclosure with a rack. A plurality of modular bricks that each include heat-generating electronic components are mounted in the rack. A fan brick that includes at least one fan is also mounted in the rack. The fan brick exchanges air between each modular brick and the fan brick to cool the electronic components in each of the modular bricks.

20 Claims, 2 Drawing Sheets

MODULAR FAN BRICK AND METHOD FOR EXCHANGING AIR IN A BRICK-BASED COMPUTER SYSTEM

FIELD OF THE INVENTION

The present invention is related to computer system cooling, and more particularly to a modular fan brick and method for exchanging air in a brick-based computer system.

BACKGROUND OF THE INVENTION

Modern computer systems typically generate a great deal of heat in a very small space. Some computer systems use air cooling techniques to draw heat away from critical components in the computer system. Air cooling is used on computers ranging from personal computers and laptops to minicomputer and mainframe systems. Air cooling systems typically use fans, or some other air moving device, to move air across electrical components in the computer system.

In conventional computer systems, fans are mounted inside of the system being cooled in order to either suck air from, or force air into, the computer system. Computer systems are continually being developed that pack more devices in smaller spaces such that there is a great deal of heat generated per unit volume. The cooling systems in such systems typically need to exchange large volumes of air to ensure that an adequate amount of heat is removed from the system. Failure to exchange adequate amounts of air can cause overheating that results in system error or failure.

Some computer systems are modular in that they are formed of one or more bricks that fit into a rack. Each brick typically contains its own electronics and fans to cool the electronics. The fans occupy valuable space within each brick that may otherwise be taken up by heat sinks and/or additional electronics. In addition, since the fans are positioned within each brick maintenance and/or replacement of a failed fan must typically be performed by qualified technicians because of potential physical and electrical dangers. The fans within each brick are also powered by currents that generate unwanted electromagnetic interference within the brick.

Thus, what is needed is a computer system and method for efficiently exchanging air with modular bricks in a brick-based computer system. The computer system and method should reduce downtime due to fan failure while at the same time exchanging adequate amounts of air through each modular brick. It would also be desirable if such a system and method utilized no space within each brick and permitted fan replacement by non-technical workers while the electronics system was running.

SUMMARY OF THE INVENTION

A modular fan brick and method for exchanging air in a brick-based computer system. The modular fan brick may be one brick in a brick-based computing system such that the modular fan brick fits into a rack with the other bricks. The modular fan brick exchanges air with one or more of the other modular bricks.

The modular fan brick includes one or more fans that are easily replaced by non-technical workers. In addition, placing the fans in a separate modular brick (i) allows electrical designers to locate additional electronics and/or heat sinks within the other modular bricks that include electronic components; and (ii) removes the electromagnetic interference, which is generated by the current that powers the fans, from the bricks that include electronic components.

One aspect provides a modular computing system that includes an enclosure, a first brick and a second brick. The first brick includes electronic components and is mounted in the enclosure. The second brick is also mounted in the enclosure and includes at least one fan to exchange air between the first brick and the second brick to cool the electronic components in the first brick.

Another aspect provides a method for directing air through a brick-based computer system. The method includes placing a first brick that includes electronic components into the computer system and placing a second brick that includes at least one fan into the computer system. The method further includes exchanging a fluid, such as air, between the first brick and the second brick to cool the electronic components in the first brick.

Still another aspect provides a modular computing system that includes an enclosure with a rack. A plurality of modular bricks that each include heat-generating electronic components are mounted in the rack. A fan brick that includes at least one fan is also mounted in the rack. The fan brick exchanges air between each modular brick and the fan brick to cool the electronic components in each of the modular bricks.

DETAILED DESCRIPTION

In the following detailed description, reference is made to the accompanying drawings in which are shown by way of illustration specific embodiments. It is understood that other embodiments may be utilized and structural changes made.

Figure 1:
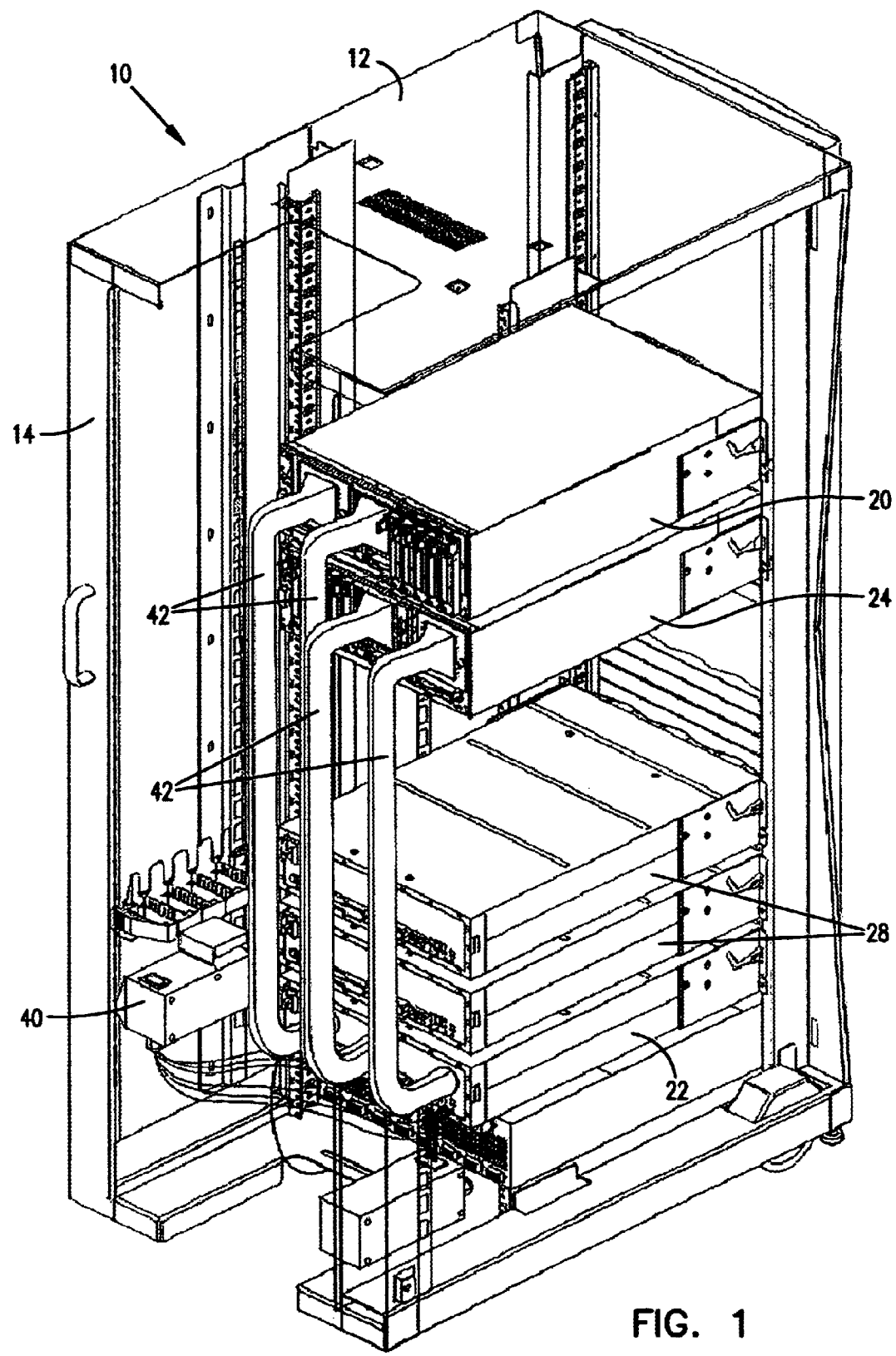
FIG. 1 shows an example modular computing system.

FIG. 1 shows a modular computing system 10. System 10 includes an enclosure 12 and a first brick 20 that is mounted in enclosure 12. First brick 20 includes electronic components (not normally visible from exterior of the brick 20) that are part of computing system 10. As used herein, a brick is any stand-alone device that forms one component of computing system 10. Bricks may have, but are not required to have, their own power source.

Figure 2:
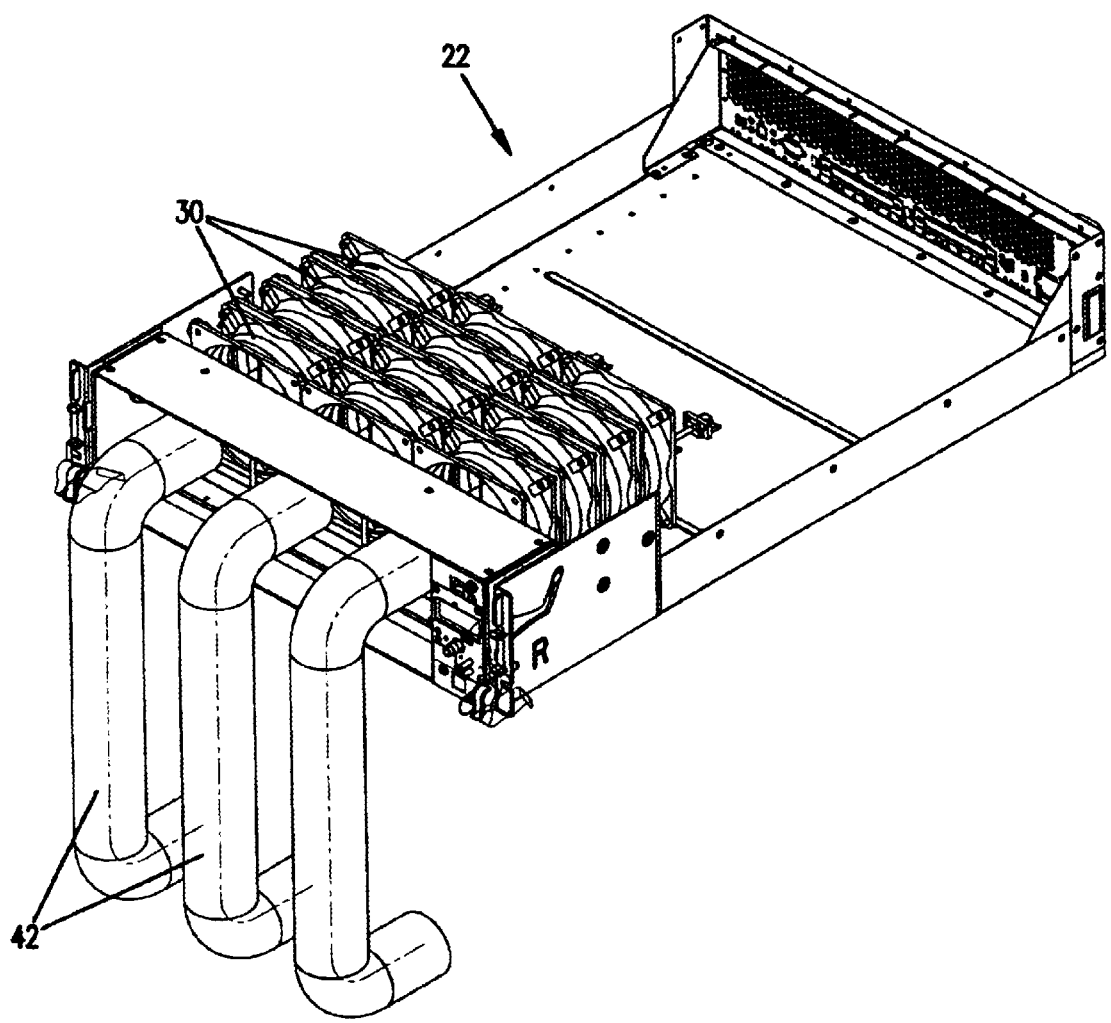
FIG. 2 shows an example fan brick that may be used in modular computing system of FIG. 1 with portions of the brick enclosure removed for clarity.

Referring now also to FIG. 2, computing system 10 further includes a second brick 22 mounted in enclosure 12. Second brick 22 includes a plurality of fans 30 that are used to exchange air between first brick 20 and second brick 22 to cool the electronic components in first brick 20. Depending on the arrangement of fans 30, second brick 22 either forces air into first brick 20, or draws air from first brick 20, to cool the electronic components in first brick 20. As used herein, a fan is any device that moves air, including a blower or impeller among others.

In the illustrated example embodiment, enclosure 12 includes a rack 14 such that first and second bricks 20, 22 are mounted in rack 14. A third brick 24 is also mounted in rack 14. Third brick 24 similarly includes electronic components that are part of computing system 10. Second brick 22 also exchanges air with third brick 24 to keep the electronic components in third brick 24 cool.

In some embodiments, system 10 includes a controller 40 that detects when there is a malfunction in second brick 22, such as when some, all or one of the fans 30 becomes damaged or inoperative. One or more backup bricks 28 may be mounted in rack 14. Backup bricks 28 include one or more fans 30 such that backup brick 28 exchanges air with first brick 20 to cool the electronic components in first brick 20 when controller 40 detects a malfunction in second brick 22.

Each brick 20, 22, 24, 28 may be the same size to promote the modular nature of the brick-based computer system 10. In alternative embodiments, the bricks may be different sizes with each brick being sized relative to a common unit, such as one-quarter size, one-half size etc.

It should be noted that the number of bricks that include electronic components and the number of bricks that includes fans will depend on the type of computer system 10. In some embodiments, bricks 20, 24 that include electronic components and bricks 22, 28 that includes fans are connected by external conduits 42 such that air passes through conduits 42 between bricks 20, 24 that include electronic components and bricks 22, 28 that includes fans 30. Conduits 42 may have to be disengaged from second brick 22 and engaged with one or more of the backup bricks 28. Bricks 20, 24 that include electronic components and bricks 22, 28 that include fans may be connected by any conventional means and arranged in the enclosure at any angle, or in any orientation.

Second brick 22 includes at least one fan 30 with the number of fans 30 in second brick 22 depending on the amount of air movement required for particular applications. The amount of air movement that is needed to cool the electronic components in the other bricks will depend on the number and type of bricks that include electronic components. In some embodiments, controller 40 is able to detect a malfunction in each of the fans 30.

A method for directing air through a brick-based computer system is also illustrated in FIGS. 1 and 2. The method includes placing a first brick 20 that includes electronic components into computer system 10, and placing a second brick 22 that includes at least one fan 30 into computer system 10. The method further includes exchanging a fluid, such as air, between first brick 20 and second brick 22 to cool the electronic components in first brick 20.

In some embodiments, exchanging air between first brick 20 and second brick 22 includes forcing air from second brick 22 to first brick 20, while in other embodiments exchanging air between first brick 20 and second brick 22 includes drawing air from first brick 20 into second brick 22. In the illustrated embodiment, the method includes placing first and second bricks 20, 22 into a rack 14 within computer system 10.

The method may further include placing a third brick 24 that includes electronic components into rack 14 within computer system 10, and exchanging air between third brick 24 and second brick 22 to cool the electronic components in third brick 24. In some example embodiments, the method includes placing one or more backup bricks 28 that include at least one fan 30 into rack 14 within computer system 10 and exchanging air between first and/or third bricks 20, 24 and a backup brick 28 to cool the electronic components in first and/or third bricks 20, 24 when there is a malfunction with one or more of the fans 30 in second brick 22.

It is understood that the above description is intended to be illustrative, and not restrictive. Many other embodiments will be apparent to those of skill in the art upon reviewing the above description. The scope of the invention should be determined with reference to the appended claims.

What is claimed is:

1. A method for directing air through a brick-based computer system, comprising;
    placing a first brick that includes electronic components into the computer system;
    placing a second brick that includes at least one fan into the computer system;
    exchanging a fluid between the first brick and the second brick to cool the electronic components in the first brick and selectively connecting at least one external conduit that passes air between the first brick and the second brick.

2. The method according to claim 1, wherein the fluid is air.

3. The method according to claim 2, wherein exchanging air between the first brick and the second brick includes forcing air from the second brick to the first brick.

4. The method according to claim 2, wherein exchanging air between the first brick and the second brick includes drawing air from the first brick to the second brick.

5. The method according to claim 2, wherein placing the first brick into the computer system includes placing the first brick into a rack within the computer system.

6. The method according to claim 5, wherein placing a second brick into the computer system includes placing the second brick into the rack within the computer system.

7. The method according to claim 6, further comprising:
    placing a third brick that includes electronic components into the rack within the computer system; and
    exchanging air between the third brick and the second brick to cool the electronic components in the third brick.

8. The method according to claim 5, further comprising placing a backup brick that includes at least one fan into the rack within the computer system.

9. The method according to claim 8, further comprising exchanging air between the first brick and the backup brick to cool the electronic components in the first brick when there is a malfunction in the second brick.

10. A modular computing system, comprising:
    an enclosure;
    a first brick mounted in the enclosure, the first brick including electronic components;
    a second brick mounted in the enclosure, the second brick including at least one fan to exchange air between the first brick and the second brick to cool the electronic components in the first brick and wherein the first and the second brick are selectively connected by at least one external conduit that passes air between the first brick and the second brick.

11. The modular computing system of claim 10, wherein the enclosure includes a rack and the first and second bricks are mounted in the rack.

12. The modular computing system of claim 11, further comprising a third brick mounted in the rack, the third brick including electronic components such that the second brick exchanges air with the third brick to cool the electronic components in the third brick.

13. The modular computing system of claim 11, further comprising a controller that detects when there is a malfunction in the second brick.

14. The modular computing system of claim 13, further comprising a backup brick mounted in the rack, the backup brick including at least one fan such that the backup brick exchanges air with the first brick to cool the electronic components in the first brick when the controller detects a malfunction in the second brick.

15. The modular computing system of claim 13, wherein the second brick includes a plurality of fans and the controller is able to detect a malfunction in each of the fans.

16. The modular computing system of claim 10, wherein the first brick and the second brick are the same size.

17. The modular computing system of claim 10, wherein the first brick is part of a plurality of bricks that each include external components and the second brick is connected to the plurality of bricks by at least one external conduit that passes air between the first brick and the plurality of bricks.

18. The modular computing system of claim 10 wherein the second brick forces air into the first brick to cool the electronic components in the first brick.

19. The modular computing system of claim 10 wherein the second brick draws air from the first brick to cool the electronic components in the first brick.

20. A modulator computing system, comprising:

an enclosure that includes a rack;

a plurality of modular bricks mounted in the rack, each modular brick including electronic components;

a fan brick mounted in the rack, the fan brick including at least one fan to exchange air between each modular brick and the fan brick to cool the electronic components in each modular brick wherein the fan brick and at least one of the modular bricks are selectively connected by at least one external conduit that passes air between the fan brick and the at least one modular brick.

* * * * *